United States Patent
Lovett et al.

(10) Patent No.: US 7,106,637 B2
(45) Date of Patent: Sep. 12, 2006

(54) ASYNCHRONOUS INTERFACE CIRCUIT AND METHOD FOR A PSEUDO-STATIC MEMORY DEVICE

(75) Inventors: Simon J. Lovett, Boise, ID (US); Cliff Zitlaw, San Jose, CA (US); Brian M. Shirley, Boise, ID (US); Roger D. Norwood, McKinney, TX (US); John F. Schreck, Lucas, TX (US)

(73) Assignee: Micron Technology, Inc., Boise, ID (US)

(*) Notice: Subject to any disclaimer, the term of this patent is extended or adjusted under 35 U.S.C. 154(b) by 41 days.

(21) Appl. No.: 10/754,658

(22) Filed: Jan. 8, 2004

(65) Prior Publication Data

US 2004/0141397 A1 Jul. 22, 2004

Related U.S. Application Data (63) Continuation of application No. 10/102,221, filed on Mar. 19, 2002, now Pat. No. 6,690,606.

(51) Int. Cl.
*G11C 7/00* (2006.01)

(52) U.S. Cl. .................. 365/194; 365/233.5; 365/233; 365/230.08; 365/222

(58) Field of Classification Search .............. 365/194, 365/233.5, 233, 230.08, 222
See application file for complete search history.

(56) References Cited

U.S. PATENT DOCUMENTS

| | | | |
|---|---|---|---|
| 4,293,926 A | 10/1981 | Amano | 364/900 |
| 5,258,952 A | 11/1993 | Coker et al. | 365/194 |
| 5,374,894 A | 12/1994 | Fong | 327/14 |
| 5,471,157 A | 11/1995 | McClure | 326/93 |

(Continued)

FOREIGN PATENT DOCUMENTS

JP   411238380 A   8/1999

OTHER PUBLICATIONS

"Intel® 1.8 Volt Wireless Flash Memory (W18/W30)," Product Brief Flash Products Group, Intel Corporation, 2002, pp. 1–2.

"1.8 Volt Intel® Wireless Flash Memory (W18)," Datasheet, Intel Corporation, Jan. 2003, pp. 1–102.

*Primary Examiner*—Anh Phung
*Assistant Examiner*—Toan Le
(74) *Attorney, Agent, or Firm*—Dorsey & Whitney LLP (57) ABSTRACT

An asynchronous address interface circuit and method for converting unrestricted randomly scheduled address transitions of memory address signals into scheduled address events from which initiation of a sequence of memory access events can be based. The address interface circuit initiates a delay sequence based on a address transition detection pulse. In the event a new address transition detection pulse is received prior to completion of the delay sequence, the delay sequence is reset and restarted based on the new address transition detection pulse. The sequence of memory access events is initiated in response to the completion of the delay sequence.

23 Claims, 5 Drawing Sheets

U.S. PATENT DOCUMENTS

| | | |
|---|---|---|
| 5,566,129 A | 10/1996 | Nakashima et al. ...... 365/233.5 |
| 5,600,605 A | 2/1997 | Schaefer ..................... 365/233 |
| 5,666,321 A | 9/1997 | Schaefer ................... 365/233.5 |
| 5,802,555 A | 9/1998 | Shigeeda ..................... 711/106 |
| 5,805,517 A | 9/1998 | Pon ............................ 365/212 |
| 5,835,440 A | 11/1998 | Manning ............... 365/230.06 |
| 6,058,070 A | 5/2000 | La Rosa ................... 365/233.5 |
| 6,075,751 A | 6/2000 | Tedrow ................... 365/233.5 |
| 6,166,990 A | 12/2000 | Ooishi et al. ................ 365/233 |
| 6,373,303 B1 | 4/2002 | Akita ......................... 327/156 |
| 6,396,758 B1 | 5/2002 | Ikeda et al. ................. 365/222 |
| 6,507,532 B1 | 1/2003 | Fujino et al. .......... 365/230.03 |
| 6,564,285 B1 | 5/2003 | Mills et al. .................. 711/103 |
| 6,597,615 B1 | 7/2003 | Mizugaki .................... 365/222 |
| 6,636,449 B1 | 10/2003 | Matsuzaki .................. 365/222 |
| 6,658,544 B1 | 12/2003 | Gray .......................... 711/167 |
| 6,675,256 B1 | 1/2004 | Harrand ..................... 711/105 |
| 6,690,606 B1 | 2/2004 | Lovett et al. ............... 365/194 |
| 6,701,419 B1 | 3/2004 | Tomaiuolo et al. ......... 711/157 |
| 6,714,479 B1 * | 3/2004 | Takahashi et al. ....... 365/233.5 |
| 6,920,524 B1 | 7/2005 | Lovett ........................ 711/106 |

* cited by examiner

ASYNCHRONOUS INTERFACE CIRCUIT AND METHOD FOR A PSEUDO-STATIC MEMORY DEVICE

CROSS-REFERENCE TO RELATED APPLICATION

This application is a continuation of U.S. patent application Ser. No. 10/102,221, filed Mar. 19, 2002, U.S. Pat. No. 6,690,606.

TECHNICAL FIELD

The present invention is related generally to the field of semiconductor memory devices, and more particularly, to an interface circuit and method for a pseudostatic memory device.

BACKGROUND OF THE INVENTION

A class of memory devices called pseudo-static memory are typically memory devices that are functionally equivalent to static random access memory (SRAM) devices, but include internal refresh circuitry, so that the devices appear to the use as not needing refresh operations. In general, these memory devices can be operated in the same manner one would operate a conventional SRAM, but have a memory core based on conventional dynamic random access memory (DRAM) cells. As is well known in the art, a major distinction between the two types of memory cells is that DRAM memory cells need to be periodically refreshed to maintain the stored data whereas SRAM memory cells do not.

There are advantages to employing a conventional DRAM memory core over a conventional SRAM memory core in a memory device. For example, memory density for a DRAM memory array can be much greater than that for a SRAM memory array. In the case of a DRAM memory cell, only one transfer gate and a storage device, typically a capacitor, is necessary to store one bit of data. Consequently, each DRAM memory cell is considerably smaller than a conventional SRAM memory cell, which may have as many as six transistors per memory cell. The simple structure and smaller size of the DRAM memory cell translates into a less complicated manufacturing process, and consequently, lower fabrication costs when compared to the SRAM memory cell.

In spite of the aforementioned advantages provided by a DRAM memory core, there are issues related to the design and operation of a conventional DRAM memory array that make its application undesirable. For example, as previously mentioned, DRAM memory cells need to be refreshed periodically or the data stored by the capacitors will be lost. As a result, additional circuitry must be included in the memory device to support the refresh operation. It is also generally the case that access times for DRAM memory cores are greater than the access times for SRAM memory cores.

Additionally, a memory access operation for a conventional DRAM memory core is such that once the operation has begun, the entire access cycle should be completed or the data will be lost. That is, a DRAM access cycle begins with a row of memory cells in the array being activated, and the respective charge state of the memory cells for the activated row are sensed and amplified. A column including a particular memory cell of the activated row is selected by coupling the column to an input/output line. At this time, data can be read from or written to the particular memory cell. Following the read or write operation, the row of memory cells is deactivated, thus, storing the charge state in the respective capacitors of the memory cells. As is generally known, the process of sensing the charge state of the memory cells is destructive, and unless the access cycle is completed with the charge state being amplified and the row being deactivated, the data stored by the memory cells of the activated row will be lost. In contrast, for a conventional asynchronous SRAM memory device, the SRAM sense operation is non-destructive and does not have the same type of access cycle as a conventional DRAM memory device. Consequently, random memory addresses may be asserted to the SRAM memory device without timing restriction, and data is always expected to be returned in a certain time thereafter. This time is typically referred to as the address access time $t_{AA}$.

Therefore, it is desirable to have a circuit that can accommodate the asynchronous nature of an SRAM memory device and transform these actions to the scheduled events of a conventional DRAM memory access operation in order to provide an asynchronous pseudo-static memory device that employs a conventional DRAM memory core.

SUMMARY OF THE INVENTION

One aspect of the present invention is directed to a method of accessing memory cells of an array of memory cells. The method includes initiating access to the array of memory cells a time period after receiving a memory address and accessing the memory cells corresponding to the memory address unless a new memory address is received before the time period elapses. In response to receiving the new memory address, access to the memory cells corresponding to the memory address operation is not initiated and access to the memory cells corresponding to the new memory address is initiated the time period after receiving the new memory address. The time period sufficient to allow access to the array of memory cells for a previous memory operation to complete. Another aspect of the invention is directed to a pseudo-static memory device that includes an address interface circuit configured to initiate a memory operation a minimum time following receipt of a last received memory address. The address interface circuit aborts a previous memory operation before initiated in the event the last received memory address is received before the minimum time elapses.

DETAILED DESCRIPTION OF THE INVENTION

Embodiments of the present invention are directed to an asynchronous interface circuit that converts randomly scheduled address transitions, such as those applied to an SRAM device, into scheduled address events which can be asserted to a conventional DRAM memory core in an orderly fashion. Certain details are set forth below to provide a sufficient understanding of the invention. However, it will be clear to one skilled in the art that the invention may be practiced without these particular details. In other instances, well-known circuits, control signals, and timing protocols have not been shown in detail in order to avoid unnecessarily obscuring the invention.

Figure 1:
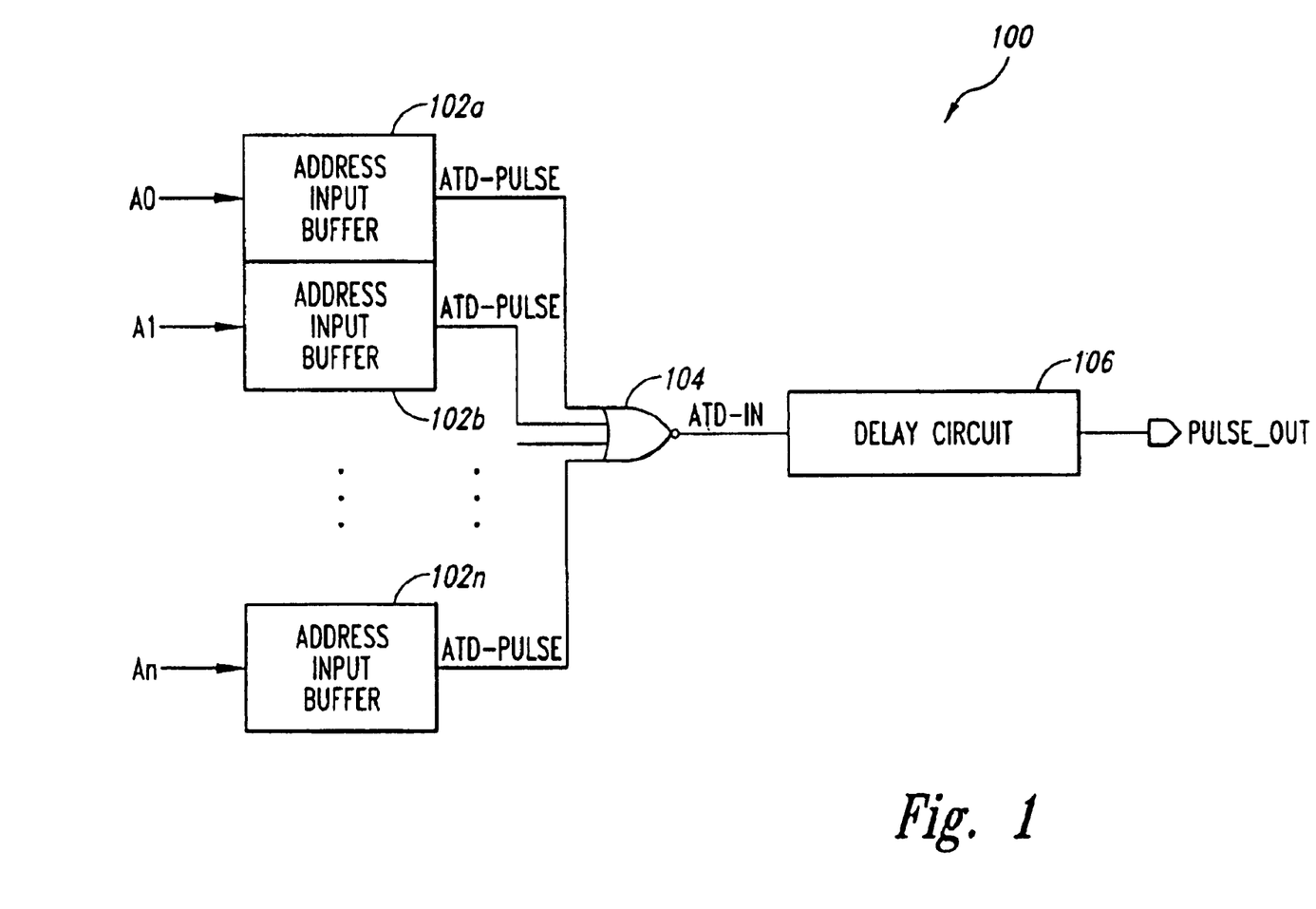
FIG. 1 is a functional block diagram of an asynchronous interface circuit according to an embodiment of the present invention.

Illustrated in FIG. 1 is an asynchronous interface circuit 100 according to an embodiment of the present invention. The asynchronous interface circuit 100 includes address input buffers 102a–n, each receiving a respective input address signal representing one bit of the input address A0–An, and further having outputs coupled to inputs of a NOR gate 104. Each of the row address input buffers 102a–n includes an address transient detector (ATD) that generates an output pulse ATD_PULSE in response to the respective input address signal making a logic state transition. The row address input buffers 102a–n, and the ATDs included in each are conventional in design and are known in the art. With the configuration shown in FIG. 1, when an ATD_PULSE is output by any of the row address input buffers 102a–102n, the NOR gate 104 generates an output pulse ATD_IN that is provided to a delay circuit 106. The delay circuit 106 generates an output PULSE_OUT that is used to begin an access operation of the DRAM memory core.

Figure 2:
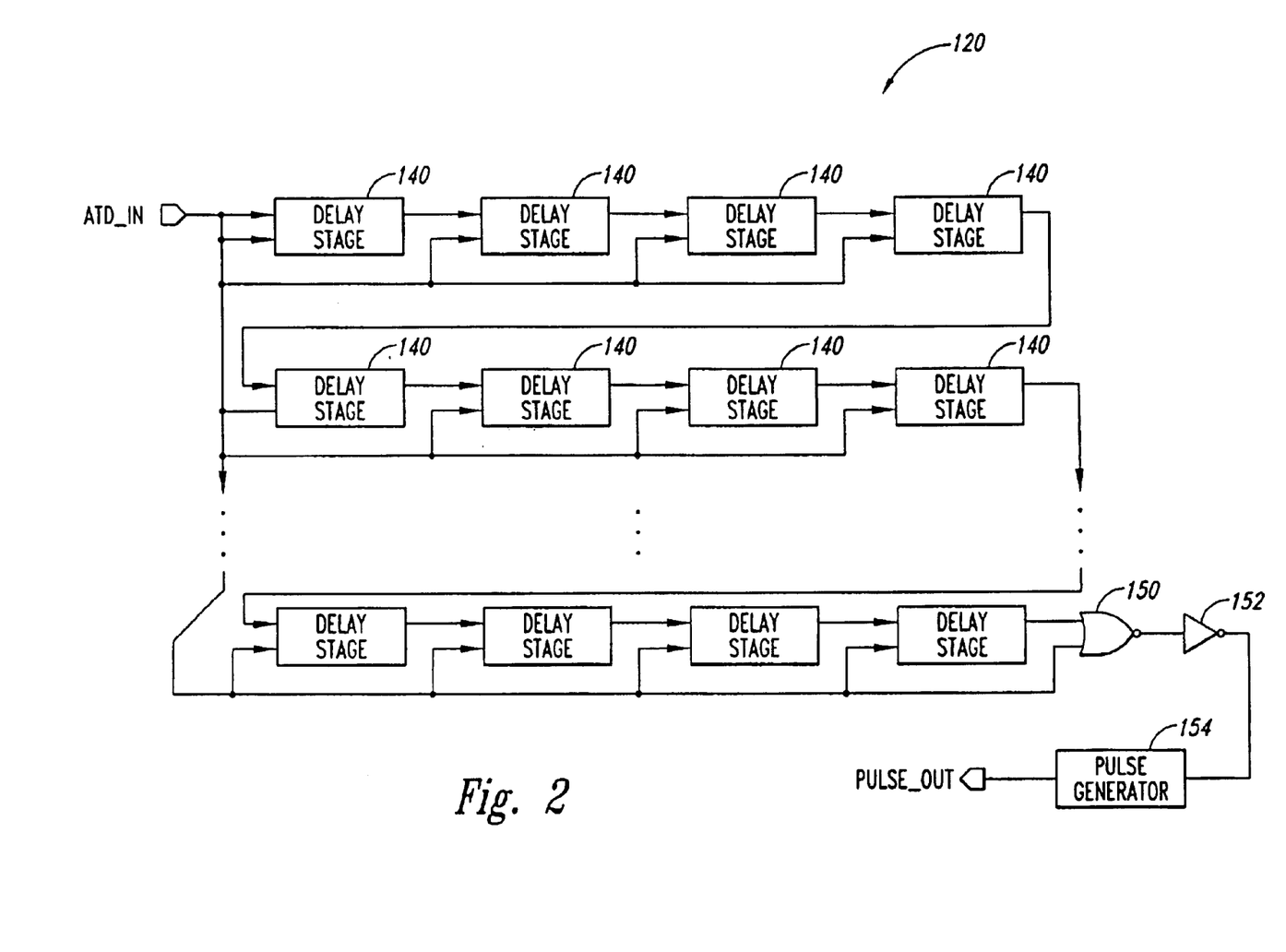
FIG. 2 is a functional block diagram of a delay circuit according to an embodiment of the present invention.
Figure 3:
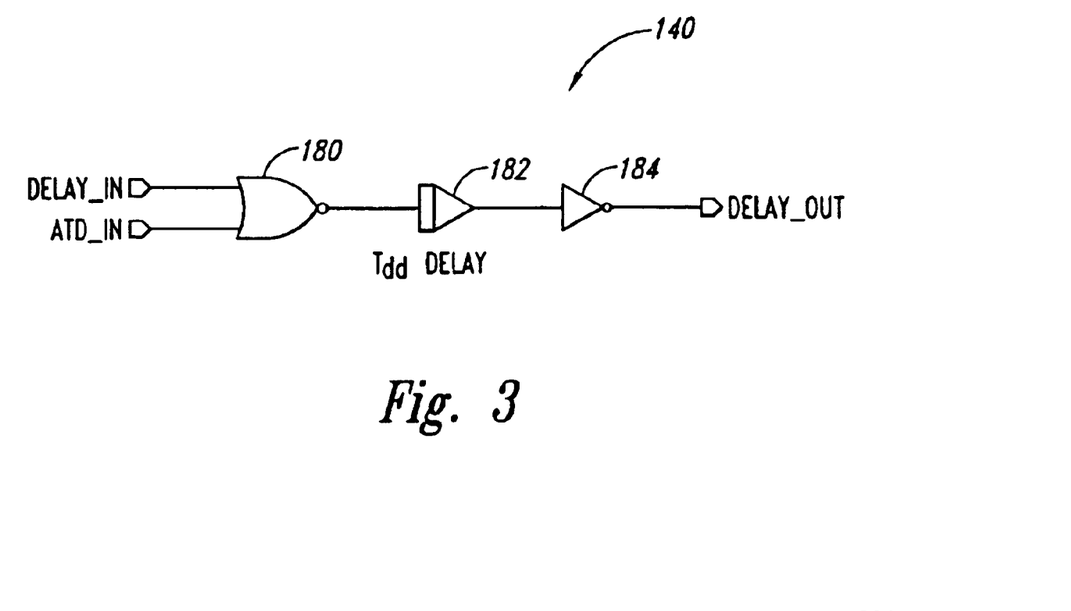
FIG. 3 is a schematic drawing of a delay stage according to an embodiment of the present invention.

The asynchronous interface circuit 100 can be used with a conventional DRAM memory core to provide an asynchronous pseudo-static SRAM operation. As previously mentioned, a conventional DRAM memory core is not well suited for the asynchronous nature of a conventional SRAM address interface because random addresses can be asserted without timing restriction. In the case of a read operation, a time period after the address is asserted, typically referred to as the address access time, $t_{AA}$, output data is provided. In the event the timing specifications are violated, and the address changes before the output data is provided, data stored by the SRAM memory core will not be lost because of the manner in which data is stored by conventional SRAM memory cells. In contrast, in a conventional DRAM memory core, once memory access of a memory location has begun, the access operation must be completed or run the risk of losing data since DRAM has intrinsically a destructive read sequence. As will be explained in more detail below, the asynchronous interface circuit 100, however, can take randomly scheduled address transitions, such as those allowed for conventional SRAM devices, and convert them into scheduled events which can be asserted to a DRAM memory core in an orderly fashion FIG. 2 illustrates a delay circuit 120 according to an embodiment of the present invention. The delay circuit 120 can be substituted for the delay circuit 106 shown in FIG. 1. The delay circuit 120 includes at least one delay stage 140. Each delay stage 140 has a delay input and an ATD input, and further has a delay output. An embodiment of the delay stage 140 is illustrated in FIG. 3. The delay stage 140 includes a two-input NOR gate 180 having an output coupled to an input of an inverter 184 through a delay device 182. A first input of the NOR gate 180 represents the delay input and a second input represents the ATD input. In operation, the delay stage 140 provides an output signal that is similar to the signal applied to the delay input except that it is delayed by a time $t_{dd}$ of the delay device 182.

With reference to FIG. 2, where the delay circuit 120 includes a plurality of delay stages 140, a first delay stage 140 receives the ATD_IN signal at both its delay input and reset input. Subsequent delay stages 140 are coupled such that the delay input is coupled to the delay output of the previous delay stage 140, as illustrated in FIG. 2. Each delay stage 140 generates at its delay output a version of the signal applied to its delay input but delayed by a time delay $t_{dd}$. The ATD input of each of the delay stages 140 is coupled to receive the ATD_IN signal. The delay output of the last delay stage 140 is coupled to a first input of a two-input NOR gate 150. A second input of the NOR gate 150 is coupled to receive the ATD_IN signal. An output of the NOR gate 150 is coupled to a pulse generator 154 through an inverter 152. The pulse generator 154 generates a pulse PULSE_OUT in response to the falling edge of signal output by the inverter 152. The PULSE_OUT signal, as previously mentioned, is used to start an access operation to a conventional DRAM memory core.

In operation, the delay circuit 120 generates a PULSE_OUT pulse a time delay $t_d$ after the falling edge of the most recent ATD_IN pulse. The time delay $t_d$ is approximately the sum of the delay of each delay stage 140. In an effort to simplify explanation of the delay circuit 120, any gate delays have been ignored. However, it will be appreciated that some time will be added to the time delay $t_d$ because of the gate delays. When the delay circuit 120 receives an ATD_IN pulse, the output of the inverter 152 goes HIGH and the delay output of each of the delay stages 140 go HIGH $t_{dd}$ after the rising edge of the ATD_IN pulse. On the falling edge of the ATD_IN pulse, the delay circuit begins counting the time delay $t_d$. That is, for the first delay stage 140 in the chain, its delay output will go LOW $t_{dd}$ after the falling edge of the ATD_IN pulse. The delay output of the second delay stage 140 will go LOW $t_{dd}$ after the falling edge of the delay output of the first delay stage 140. Thus, the falling edge of the ATD_IN pulse will trickle through the chain of delay stages 140 until being applied to the input of the NOR gate 150. Note that during this time, the output of the inverter 152 has remained HIGH. Not until the delay output of the last delay stage 140 goes LOW, which occurs $t_d$ after the falling edge of the ATD_IN signal, will the output of the inverter 152 go LOW. When this does occur, the pulse generator 154 then generates a PULSE_OUT pulse that can be used to start an access operation to a DRAM memory core.

In the case where a second ATD_IN pulse is received by the delay circuit 120 before the $t_d$ timing count has elapsed, the delay stages 140 of the timing chain are essentially reset because the delay output of each of the delay stages 140 will go HIGH again in response to the new ATD_IN pulse. The $t_d$ countdown will begin again in response to the falling edge of the new ATD_IN pulse, as previously described. In effect, the pulse generator 154 will not generate a PULSE_OUT pulse until $t_d$ after the falling edge of the last ATD_IN pulse provided to the delay circuit 120, and consequently, no access operation will be initiated until that time.

Thus, it can be seen that an unrestricted address transition input pattern can be converted by the asynchronous interface circuit 100 (FIG. 1) into scheduled address events suitable for scheduled array accesses of a DRAM memory core. That is, with the asynchronous interface circuit 100, once a given address is asserted to the DRAM memory core, no new addresses are asserted until the access in progress has completed.

Figure 4:
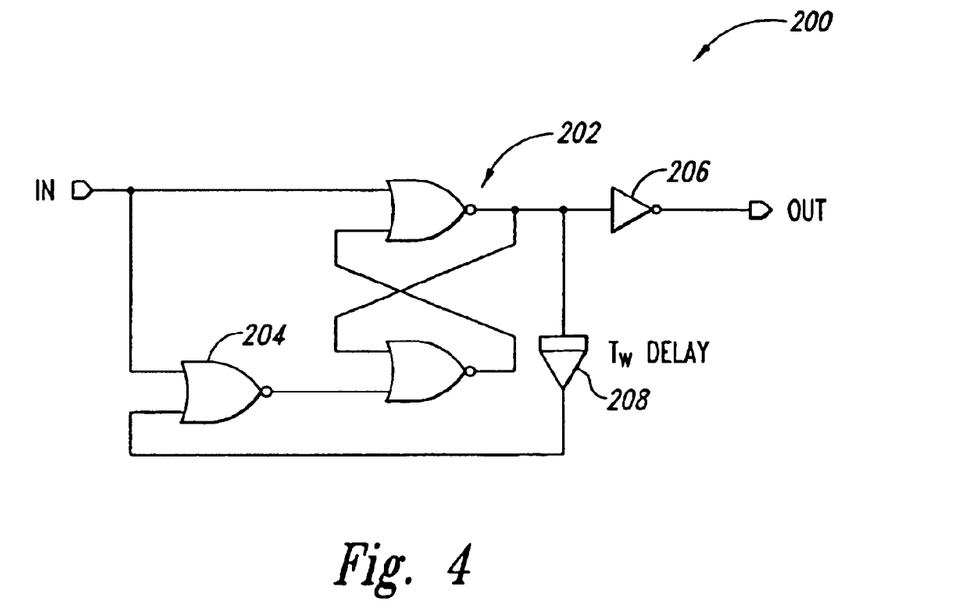
FIG. 4 is a schematic drawing of a pulse circuit according to an embodiment of the present invention.

FIG. 4 illustrates a pulse circuit 200 according to an embodiment of the present invention. The pulse circuit can be used to generate an output pulse signal OUT having a minimum pulse width of $t_w$ even if the input pulse signal IN has a pulse width less than tw. The pulse circuit 200 can be used to ensure that the ATD_IN signal provided to the delay circuit 120 (FIG. 2) is of sufficient width to reset the delay stages 140 and prevent the pulse generator 154 from generating a PULSE_OUT signal that will inadvertently initiate an access operation of a DRAM memory core. In one embodiment of the present invention, the pulse circuit 200 is coupled between the output of the NOR gate 104 (FIG. 1) and the input of the delay circuit 106. Thus, even if the output pulse of the NOR gate 104 has a pulse width less than $t_w$, the output pulse of the pulse circuit 200 will provide to the delay circuit 106 a ATD_IN signal of sufficient pulse width to reset the delay circuit 106. It will be appreciated by those of ordinary skill in the art that the polarity of the signals can be reversed in an alternative implementation of the pulse circuit 200 and remain in the scope of the present invention.

The pulse circuit 200 includes an active HIGH S-R latch 202 formed from two cross-coupled NOR gates. The latch 202 has a first input coupled to receive the IN signal and a second input coupled to the output of a two-input NOR gate 204. The output of the latch 202 is coupled to an inverter 206, from which the OUT signal is provided. The output of the latch 202 is also coupled to a first input of the NOR gate 204 through a delay device 208 having a time delay of tw. A second input off the NOR gate 204 is coupled to receive the IN signal. As a result, the pulse circuit 200 will generate an OUT signal having a pulse width of at least $t_w$ from a pulse IN signal, even if the pulse width of the IN signal is less than tw, and no matter how many times the IN signal transitions during the time tw.

It will be appreciated that the length of delay time $t_d$ for the delay circuit 120 (FIG. 2) can be selected to accommodate various operations related to having a DRAM memory core. For example, as previously mentioned, as is well known in the art, DRAM memory cells need to be periodically refreshed to retain data. The delay $t_d$ through the delay chain 120 can be selected such that a memory array refresh operation can be performed during $t_d$. That is, the time for $t_d$ can be matched according to the memory array refresh access time taking into consideration such factors as the impedance and gate delays encountered during the refresh operation. By selecting $t_d$ in this fashion, a memory array refresh operation that is in progress can be completed, and thus, avoid any potential loss of data, although a new address assertion is made during the operation because actual access to the memory array is not initiated until after the delay time $t_d$ has elapsed. By this time, the memory refresh operation would have been completed.

The selection of $t_d$ will determine to some degree the delay time $t_{dd}$ of the delay device 182 (FIG. 3) in each delay stage 140. It will be appreciated that $t_d$ and $t_{dd}$ are related in, a manner that $t_d$ is roughly the product of the number of delay stages 140 and $t_{dd}$. Thus, for a given time $t_d$, fewer delay stages can be used where $t_{dd}$ is made longer. Alternatively, more delay stages could be used where $t_{dd}$ is made shorter. Moreover, although the each delay stage 140 has been described herein as having the same delay time $t_{dd}$, the delay time of each delay stage can be modified such that more than one common $t_{dd}$ is used without departing from the scope of the present invention.

With respect to selecting a suitable time delay $t_w$ for the delay device 208 in the pulse circuit 200 (FIG. 4), $t_w$ can be selected so that a pulse generated by the pulse circuit 200 will ensure that each of the delay stages 140 will be reset, even if the input pulse to the pulse circuit 200 is less than $t_w$.

As previously mentioned, it will be appreciated that the polarity of many of the signals can be reversed without departing from the scope of the present invention. Consequently, alternative embodiments of the invention can be implemented through the use of alternative circuitry that accommodate the reversed signal polarity and remain within the invention. For example, the delay stage 140 (FIG. 3) has been illustrated and described as including a two-input NOR gate 180. However, a delay stage could also be implemented using a two-input NAND gate if the polarity of the signals are reversed. Other previously described circuits can be modified in the same manner, as is well known in the art. Thus, as previously discussed, the particular polarity and associated circuitry used in implementing embodiments of the present invention can be modified without departing from the scope of the present invention.

Figure 5:
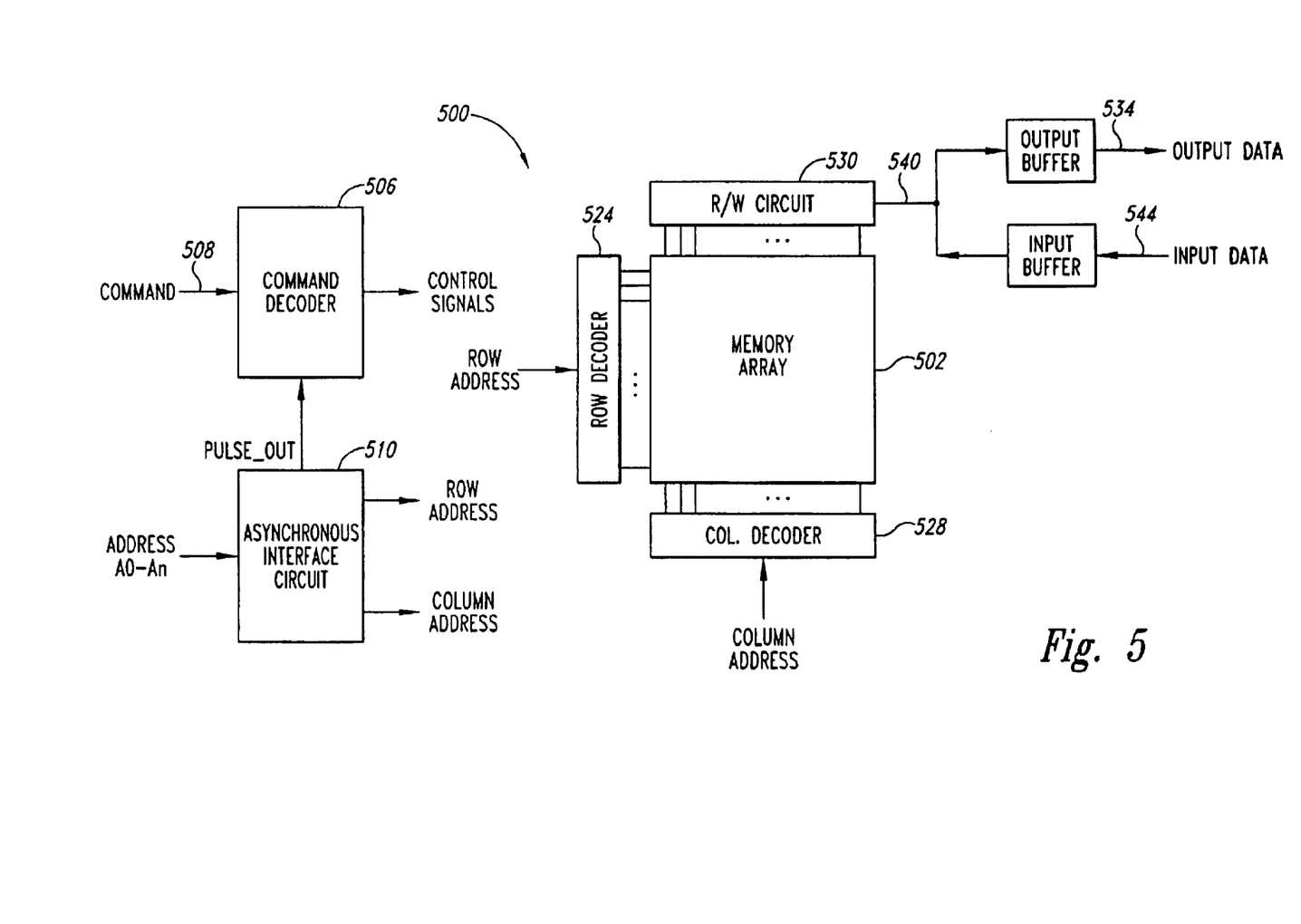
FIG. 5 is a functional block diagram of a portion of a memory device including an asynchronous interface circuit according to an embodiment of the present invention.

FIG. 5 illustrates a portion of a memory device 500 according to an embodiment of the present invention. The memory device 500 is an asynchronous pseudostatic SRAM that includes a conventional DRAM memory array 502. The memory device 500 includes a command decoder 506 that receives memory commands through a command bus 508 and generates corresponding control signals within the memory device 500 to carry out various memory operations. Row and column address signals are applied to the memory device 500 through an address bus 520 and provided to an asynchronous interface circuit 510 that is in accordance with an embodiment of the present invention. As previously described, the asynchronous interface circuit 510 generates a PULSE_OUT pulse to start an access operation to the memory array 502. As illustrated in FIG. 5, the PULSE_OUT pulse is provided to the command decoder 506. However, it will be appreciated that the PULSE_OUT signal can be provided to alternative or additional functional blocks of the memory device 500 without departing from the scope of the present invention.

The row and column addresses are provided by address input buffers (not shown) included in the asynchronous interface circuit 510 for decoding by a row address decoder 524 and a column address decoder 528, respectively. Memory array read/write circuitry 530 are coupled to the array 502 to provide read data to a data output buffer 534 via a input-output data bus 540. Write data are applied to the memory array 502 through a data input buffer 544 and the memory array read/write circuitry 530. The command controller 506 responds to memory commands applied to the command bus 508 to perform various operations on the memory array 502. In particular, the command controller 506 is used to generate internal control signals to read data from and write data to the memory array 502. During one of these access operations, an address provided on the address bus 520 is decoded by the row decoder 524 to access one row of the memory array 502. Likewise, input provided on the address bus 520 is decoded by the column decoder 528 to access at least one column of the memory array 502. During a read operation, the data stored in the addressed memory cell or cells are then transferred to the output buffer 534 and provided on the data output lines. In a write operation, the addressed memory cell is accessed and data provided on the data input lines and the data input buffer 544 is stored in the cell.

Figure 6:
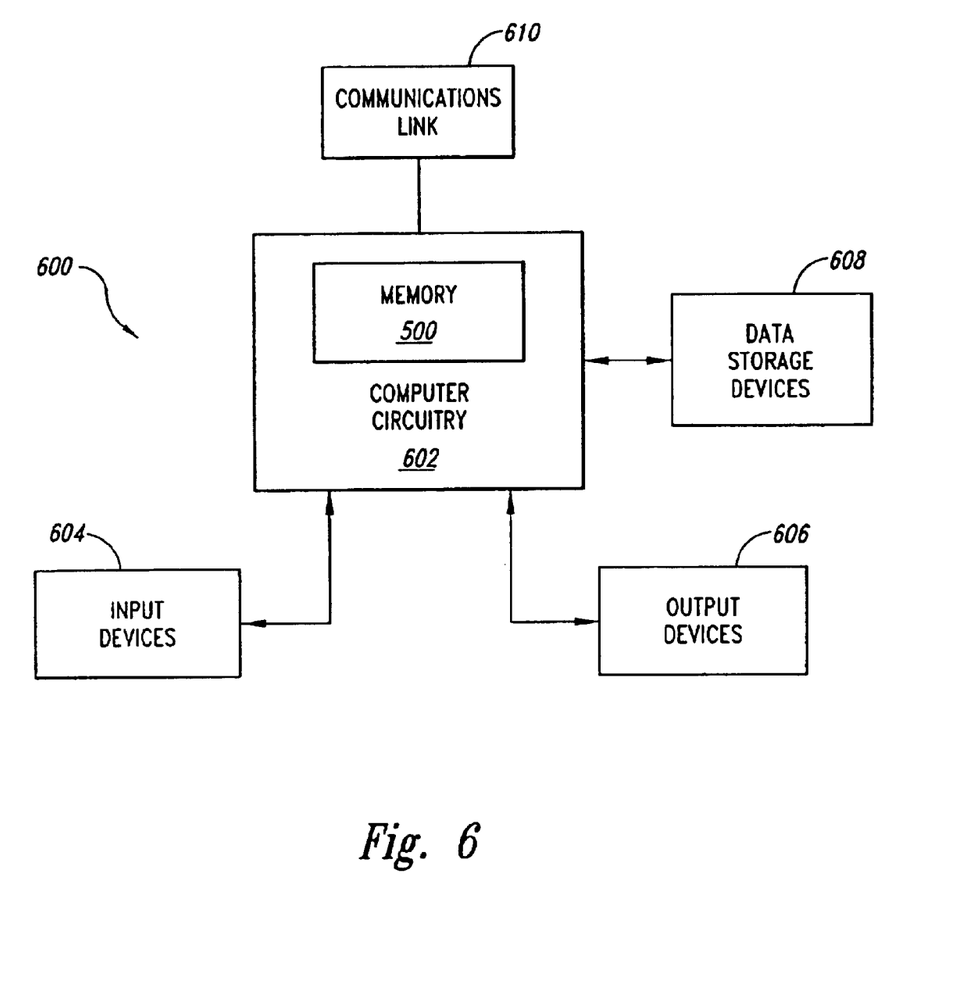
FIG. 6 is a functional block diagram of a computer system including memory devices of FIG. 5.

FIG. 6 is a block diagram of a computer system 600 including computer circuitry 602 that contains the memory device 500 of FIG. 5. The computer circuitry 602 performs various computing functions, such as executing specific software to perform specific calculations or tasks. In addition, the computer system 600 includes one or more input devices 604, such as a keyboard, coupled to the computer circuitry 602 to allow an operator to interface with the computer system. Typically, the computer system 600 also includes one or more output devices 606 coupled to the computer circuitry 602, such output devices typically being a display device. One or more data storage devices 608 are also typically coupled to the computer circuitry 602 to store data or retrieve data. Examples of storage devices 608 include hard disks and non-volatile memory. The computer system 600 also includes a wireless communication link 610 through which the computer circuitry can send and receive data through a wireless medium. The computer circuitry 602 is typically coupled to the memory device 500 through appropriate address, data, and control busses to provide for writing data to and reading data from the memory.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A pseudo-static memory device receiving command and address signals at command and address terminals, respectively, the pseudo-static memory device comprising:
   an array of memory cells;
   an address decoding circuit coupled to the array of memory cells for decoding memory address signals representing memory addresses and accessing the memory cells of the array corresponding to the memory addresses;
   a data input/output circuit coupled to the array of memory cells to couple data to and from the memory cells of the array;
   a command decoder circuit coupled to the command terminals, the array of memory cells and the data input/output circuit, the command decoder circuit adapted to decode command signals and generate internal memory signals to perform memory operations; and
   an address interface circuit coupled to the command decoder circuit, the address decoding circuit and the address terminals to enable the command decoder circuit and initiate a memory operation a minimum time following receipt of a last received memory address, the minimum time sufficient to allow access to the array of memory cells for a previous memory operation to complete, the address interface circuit aborting the previous memory operation before being intitiated in the event the last received memory address is received before the minimum time elapses.

2. The pseudo-static memory device of claim 1 wherein the array of memory cells comprises an array of dynamic random access memory cells.

3. The pseudo-static memory device of claim 2, further comprising a refresh circuit coupled to the array of memory cells and adapted to refresh memory cells of the array and wherein the minimum time is sufficient to allow completion of a refresh operation of the refresh circuit.

4. The pseudo-static memory device of claim 1 wherein the interface circuit comprises:
   an address transient detection circuit coupled to the address terminals and adapted to receive address signal and generate a detection pulse in response to each transition in the address signals;
   a delay circuit having an input coupled to the address transient detection circuit to receive the detection pulse and further having an output at which a trigger signal is provided, the delay circuit generating the trigger signal the minimum time following the last received detection pulse; and
   a pulse generator having an input coupled to receive the trigger signal generated by the delay circuit and further having an output at which a an initiation pulse is provided in response to the trigger signal to initiate a memory access operation.

5. A pseudo-static memory device, comprising:
   an array of memory cells;
   a command decoder circuit coupled to the array of memory cells and adapted to decode command signals and generate internal command signals to perform memory operations corresponding to the command signals;
   a memory address decoding circuit coupled to the array of volatile memory cells and adapted to decode memory address signals and select memory cells corresponding to the memory address signals for memory operations; and
   an address interface circuit coupled to the command decoder circuit and the memory address decoding circuit and adapted to initiate a memory operation at a first time relative to a transition of at least one of the address signals to provide sufficient time for access to the memory cells of a previous memory operation to complete unless at least one of the address signals transitions before the first time, in response to at least one of the address signals transitioning before the first time, the memory operation for the previous transition of at least one of the address signals is not initiated and a memory operation for the most recent transition of at least one of the address signals is initiated at a second time relative to the mose recent transition.

6. The pseudo-static memory device of claim 5 wherein the array of memory cells comprises an array of dynamic random access memory cells.

7. The pseudo-static memory device of claim 6, further comprising a refresh circuit coupled to the array of memory cells and adapted to refresh memory cells of the array and wherein the minimum time is sufficient to allow completion of a refresh operation of the refresh circuit.

8. The pseudo-static memory device of claim 5 wherein the interface circuit comprises:
   an address transient detection circuit having memory address nodes to which the memory address signals are applied and adapted to generate a detection pulse in response to transitions of the address signals;
   a delay circuit having an input coupled to the address transient detection circuit to receive the detection pulse and further having an output at which a trigger signal is provided, the delay circuit generating the trigger signal a minimum time following the last received detection pulse; and
   a pulse generator having an input coupled to receive the trigger signal generated by the delay circuit and further having an output at which a an initiation pulse is provided in response to the trigger signal to initiate a memory access operation.

9. A method for accessing an array of dynamic random access memory cells, comprising:
   initiating access to the array of memory cells a time period after receiving a memory address, the time period sufficient to allow access to the array of memory cells for a previous memory operation to complete; and
   accessing the memory cells corresponding to the memory address unless a new memory address is received before the time period elapses whereupon access to the memory cells corresponding to the memory address operation is not initiated and access to the memory cells corresponding to the new memory address is initiated the time period after receiving the new memory address.

10. The method of claim 9 wherein initiating access to the array of memory cells a time period after receiving the memory address comprises initiating a delay sequence having a time delay equal to the time period in response to receiving the memory address.

11. The method of claim 10 wherein accessing the memory cells corresponding to the memory address unless a new memory address is received before the time period elapses comprises restarting the delay sequence in response to receiving the new memory address prior to completion of the delay sequence previously initiated; and otherwise starting a sequence of access events in response to the completion of the delay sequence previously initiated.

12. The method of claim 10 wherein initiating access to the array of memory cells a time period after receiving the memory address comprises:

generating a transition detection pulse in response to detecting a transition in a memory address signal representing the memory address; and propagating a falling edge of the last transition detection pulse generated through a delay chain having a time delay approximately equal to the time period; and generating an initiation pulse to start a sequence of access events upon the time delay elapsing to access the memory cells.

13. The method of claim 9, further including refreshing memory cells of the array of memory cells.

14. A method for accessing memory cells of an array of memory cells, the method comprising:

receiving a first memory address corresponding to memory cells in the array of memory cells;

receiving a second memory address corresponding to memory cells in the array of memory cells a first length of time after receipt of the first memory address and prior to accessing memory cells corresponding the first memory address;

aborting access to the memory cells corresponding to the first memory address before the access is initiated; and initiating access to the memory cells corresponding to the second memory address a time period following receipt of the second memory address, the first length of time less than the time period.

15. The method of claim 13 wherein initiating access to the memory cells corresponding to the second memory address a time period following receipt of the second memory address comprises:

generating a transition detection pulse in response to detecting a transition in a memory address signal representing the second memory address; and propagating a falling edge of the last transition detection pulse generated through a delay chain having a time delay approximately equal to the time period; and generating an initiation pulse to start a sequence of access events upon the time delay elapsing to access the memory cells corresponding to the second memory address.

16. The method of claim 13, further comprising initiating a delay sequence in response to receiving the first memory address and restarting the delay sequence in response to receiving the second memory address prior to the completion of the delay sequence, the delay sequence having a time delay approximately equal to the time period.

17. The method of claim 14 wherein the array of volatile memory cells comprises an array of dynamic random access memory cells.

18. The method of claim 14, further including refreshing memory cells of the array of memory cells.

19. A method for accessing memory cells of a memory array, comprising:

receiving a first memory address;

beginning a time delay in response to receiving the first memory address, after which access to memory cells corresponding to the first memory address is initiated;

receiving a second memory address before access to memory cells corresponding to the first memory address is initiated;

restarting the time delay in response to receiving the second memory address; and canceling access to the memory cells corresponding to the first memory access before access is initiated; and accessing memory cells corresponding to the second memory address in response to the time delay elapsing.

20. The method of claim 19 wherein beginning a time delay comprises initiating a delay sequence having the time delay, restarting the time delay comprises resetting the delay sequence in response to receiving the second memory address.

21. The method of claim 20 wherein beginning the time delay in response to receiving the first memory address comprises:

generating a transition detection pulse in response to detecting a transition in a memory address signal representing the first memory address; and propagating a falling edge of the last transition detection pulse generated through a delay chain having the time delay.

22. The method of claim 21 wherein receiving a second memory address before access to memory cells corresponding to the first memory address is initiated comprises generating a transition detection pulse in response to detecting a transition in the memory address signal representing the second memory address prior to the propagation of the falling edge of the detection pulse through the entire delay chain and accessing memory cells corresponding to the second memory address in response to the time delay elapsing comprises generating an initiation pulse to start the sequence of access events upon the time delay elapsing following the restarting of the time delay.

23. The method of claim 19, further including refreshing memory cells of the array of memory cells.

* * * * *